United States Patent [19]

Hong et al.

[11] Patent Number: 5,801,457
[45] Date of Patent: Sep. 1, 1998

[54] UNIT FOR MAINTAINING INFORMATION REGARDING THE STATE OF A DEVICE DURING BATTERY POWER

[75] Inventors: Chang Hee Hong, Fremont; John H. Pasternak, Campbell, both of Calif.

[73] Assignee: Waferscale Integration, Inc., Fremont, Calif.

[21] Appl. No.: 749,615

[22] Filed: Nov. 18, 1996

[51] Int. Cl.$^6$ .................................................. H02J 1/00
[52] U.S. Cl. .................................................. 307/80; 365/226
[58] Field of Search .................................. 323/311, 312; 364/492, 493, 707; 365/226, 227, 228, 229; 327/535, 538, 545; 307/64, 66, 69, 71, 80

[56] References Cited

U.S. PATENT DOCUMENTS

| | | | |
|---|---|---|---|
| 4,730,121 | 3/1988 | Lee et al. | 307/66 |
| 4,908,790 | 3/1990 | Little et al. | 364/900 |
| 5,191,529 | 3/1993 | Ramsey et al. | 364/424.04 |
| 5,237,699 | 8/1993 | Little et al. | 395/750 |
| 5,315,549 | 5/1994 | Scherpenberg et al. | 365/189.09 |
| 5,557,229 | 9/1996 | Eitan | 327/374 |
| 5,689,085 | 11/1997 | Eitan et al. | 327/546 |

*Primary Examiner*—Matthew V. Nguyen
*Attorney, Agent, or Firm*—Skjerven, Morrill, MacPherson, Franklin & Friel LLP

[57] ABSTRACT

A unit for maintaining the value of information regarding the state of a device during battery power includes one local latch per bit of state to be maintained. The latch is powered by a switched power supply which switches between main and battery power supplies. The latch latches the value of the bit of state when the value of the bit of state is valid and the power of the device is significant and maintains the value otherwise, typically during battery operation.

9 Claims, 4 Drawing Sheets

UNIT FOR MAINTAINING INFORMATION REGARDING THE STATE OF A DEVICE DURING BATTERY POWER

CROSS REFERENCE TO RELATED FILES

This application is related to the following patent applications, all filed on the same day herewith and assigned to the common assignee of the present invention: Ser. No. 08/749,616, entitled "Backup Battery Switch with First Power Up Control", Ser. No. 08/749,616, entitled "Battery Backed Configurable Output Buffer", and Ser. No. 08/749,618, entitled "Backup Battery Switch".

FIELD OF THE INVENTION

The present invention relates generally to units providing configuration and other data defining the state of a device and to such units which maintain such state data during battery operation.

BACKGROUND OF THE INVENTION

Programmable system devices (PSDs), such as those produced by Waferscale Integration Inc., the assignee of the present invention, combine volatile random access memory (RAM) arrays, also known as "static RAMs" or SRAMs, programmable logic devices (PLDs), electrically programmable read only memory (EPROM) arrays and logic blocks on a single chip.

PSDs and other programmable chips typically include user-defined configuration bits defining how the device will operate for the specific implementation. For example, one configuration bit might indicate whether an input/output pin functions as an input pin or as an output pin.

SRAMs require a power supply to maintain the information stored therein. Typically, the power supply is the main supply for the entire VLSI circuit. However, if the VLSI circuit is of the type which occasionally is shut off, the information stored in the SRAM array will be lost.

Those circuits which require that the information be maintained have battery backup power supplies which are activated when the main power supply has failed or is powered down. The battery backup power supply voltage level is typically the lowest voltage level necessary to maintain the information and is typically significantly less than the main supply voltage level.

To utilize a backup power supply, a switching circuit is necessary which continually compares the voltage levels of the two supplies and switches to the backup power supply when the voltage level of the main supply falls below that of the backup power supply. The output of the switching circuit is a switched power supply signal.

Unfortunately, although the SRAM information is maintained during battery operation, none of the configuration or other information regarding the current state of the device is maintained. Since most configuration bits define the internal operation of the device this is generally not a problem. However, for chips which configure the elements which respond under battery power (such as the SRAM and the input/output pins), the lack of configuration information can be disastrous.

SUMMARY OF THE PRESENT INVENTION

It is therefore an object of the present invention to provide a unit for maintaining information regarding the state of a device during battery power.

In one embodiment, the information to be maintained is the values of those configuration bits which define how the device communicates to the external world and of any other data necessary for proper functioning of the device during battery power.

For example, a configuration bit might define if a pin is to receive input or provide output. Each pin has a default configuration to which the pin will return if the configuration information is "lost" somehow, such as during standby power. Upon return to main power, the pin might have the wrong configuration and the data signals to it will either be ignored or will cause serious damage to the device.

There is therefore provided, in accordance with a preferred embodiment of the present invention, a unit which includes an architecture configuration register and a plurality of local latches. The architecture configuration register is powered by a main power supply and stores at least one battery backable configuration bit. There is one local latch per battery backable configuration bit which is powered by a switched power supply. Each latch latches the value of its associated battery backable configuration bit during main power and maintains the value during battery operation.

In an alternative embodiment, the architecture configuration register is replaced with a state machine. The state machine can be a programmable logic device.

Additionally, in accordance with a preferred embodiment of the present invention, each local latch includes a latch and a pass transistor. The latch latches the value and the pass transistor passes the value to the latch when both the data of the architecture configuration register (or the state machine) is valid and the main power supply is above a predetermined voltage level. The pass transistor isolates the latch from the architecture configuration register (or the state machine) otherwise.

Moreover, in accordance with a preferred embodiment of the present invention, the latch includes a unit which forces a default output prior to first powering up of the main power supply.

Finally, the present invention can include a control line controlling the pass transistor and carrying a control signal which is active only when both the contents of the architecture configuration register (or state machine) are valid and the main power supply is above a minimum operating voltage level.

BRIEF DESCRIPTION OF THE DRAWINGS

The present invention will be understood and appreciated more fully from the following detailed description taken in conjunction with the drawings in which.

DETAILED DESCRIPTION OF PREFERRED EMBODIMENTS

Figure 1A:
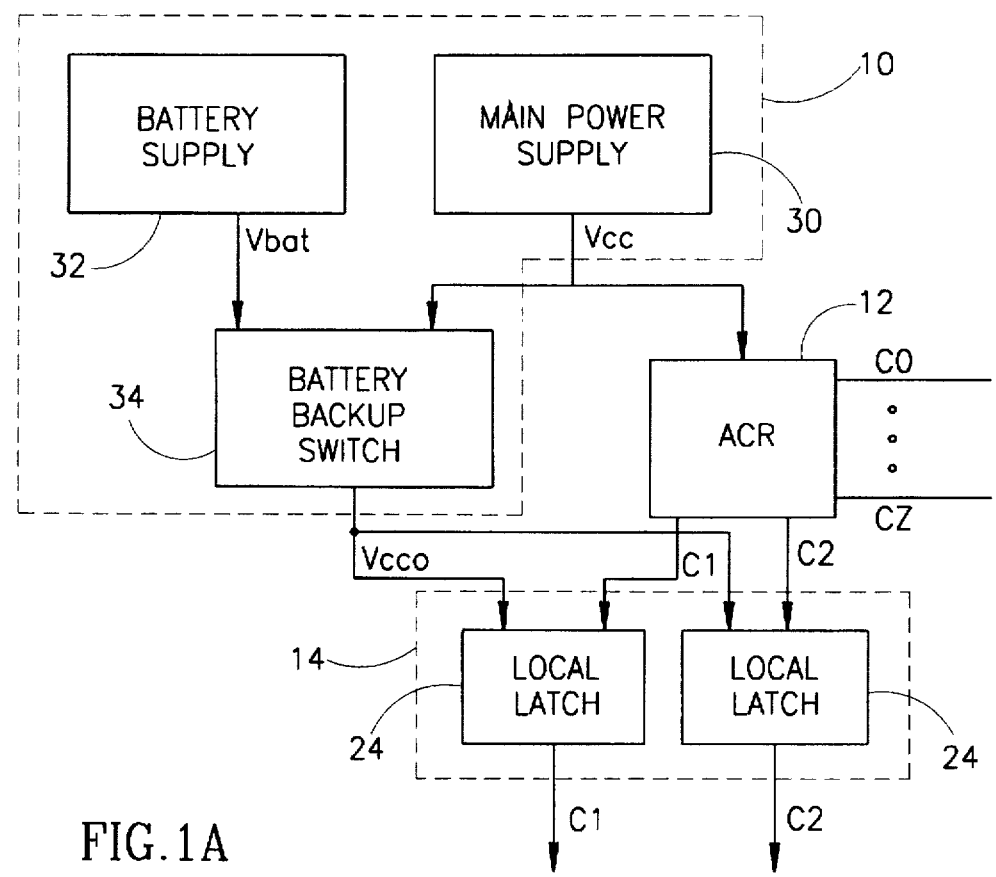
FIGS. 1A and 1B are block diagram illustrations of the unit of the present invention in two embodiments.
Figure 1B:
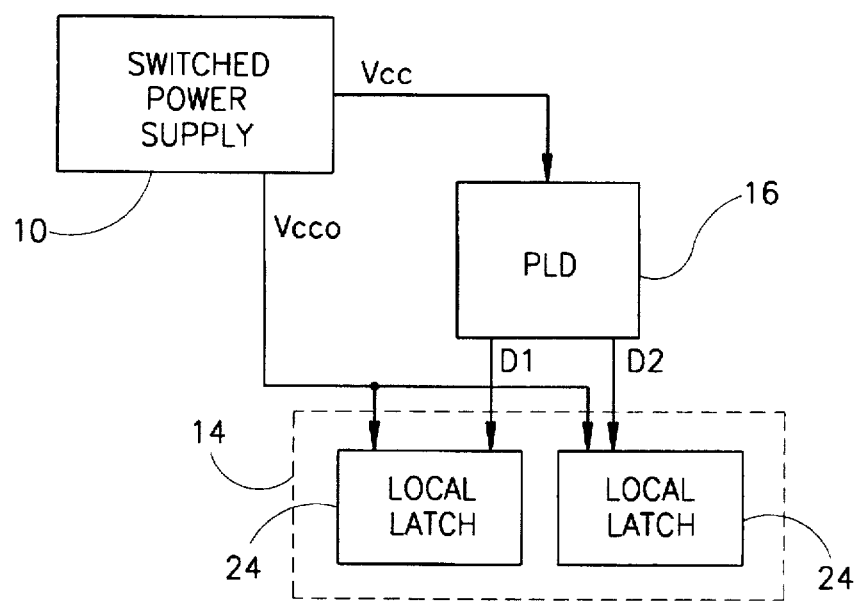

Reference is now made to FIGS. 1A and 1B which illustrate, in block diagram format, a unit for maintaining information, during battery power, regarding the state of a device, constructed and operative in accordance with a preferred embodiment of the present invention. The unit of the present invention can form part of any configurable device. FIG. 1A shows a switched power supply 10, an architecture configuration register (ACR) 12 and a data maintaining unit 14. FIG. 1B shows switched power supply 10, a programmable logic device 16, and data maintaining unit 14.

The switched power supply 10 provides a switched power supply signal Vcco to any elements of the device which require continual power. As detailed in FIG. 1A, the switched power supply 10 comprises a main power supply 30 supplying a main supply Vcc, a battery 32 supplying battery supply Vbat and a battery backup switch 34 which switches between the main supply Vcc and the battery supply Vbat, always selecting the supply with the highest voltage level. Switch 34 can be any suitable switch such as are known in the prior art. For example, switch 34 can be the one described in U.S. Pat. No. 4,908,790 to Little et al. or the one described in the U.S. Patent Application entitled "Battery Backup Switch", filed the same day herewith and is assigned to the common assignee of the present invention, both of whose descriptions are incorporated herein by reference.

The architecture configuration register 12 is powered by the main supply Vcc and provides configuration information, typically in the form of configuration bits, to the various elements of the device. The data maintaining unit 14 maintains a portion of the configuration information active at all times, whether under main or battery power, as long as the main power supply has been powered up at least once already.

Most of the configuration bits Ci affect the internal operation of the device and thus, are not utilized during battery operation. However, the configuration bits Cj which configure an element which defines how the device communicates with the external world must be available during battery power. For example, a configuration bit might indicate whether an input/output pin is either an input or an output pin. This information must be maintained during battery power to ensure that no signal is incorrectly received at the pin. Another configuration bit might indicate whether or not an SRAM should be powered during battery power. Other configuration bits might define the configurations of various elements such as the busses and buffers of the device or how an output buffer operates during battery operation. These types of configuration bits Cj must be "battery backable" (i.e. must stay valid during battery operation). The present invention incorporates all types of configuration bits which must be battery-backed.

In accordance with a preferred embodiment of the present invention, the data maintaining unit 14 is powered by the switched power supply Vcco and comprises a plurality of local latches 24, each latching the value of one battery backable configuration bit. Upon battery insertion, the local latches 24 provide a well-defined default value. During operation with main power, the local latches 24 latch the value of the relevant configuration bit (which can change over time if desired) and provide the last value of their configuration bit to the element to be configured. During battery operation, the local latches 24 maintain the latched values stored therein and provide them to the relevant elements. Upon return to main power, the local latches 24 maintain the latched value until the voltage level of the main power supply is high enough and the data in the architecture configuration register is known to be valid. At that point, the local latches 24 return to their regular operation, latching the current values of the configuration bits.

It will be appreciated that the data maintaining unit 14 of the present invention can maintain values of other data besides those of configuration bits. For example, as shown in FIG. 1B, unit 14 can maintain the latest output value(s), for example D1 and D2, of a state machine which might, for example, be implemented in a programmable logic device 16 powered by the main power supply Vcc.

The remaining discussion will detail the operation for the first embodiment, that with the architecture configuration register 12, it being appreciated that the explanation is applicable to the second embodiment also. Any differences are so noted in the test.

Figure 2:
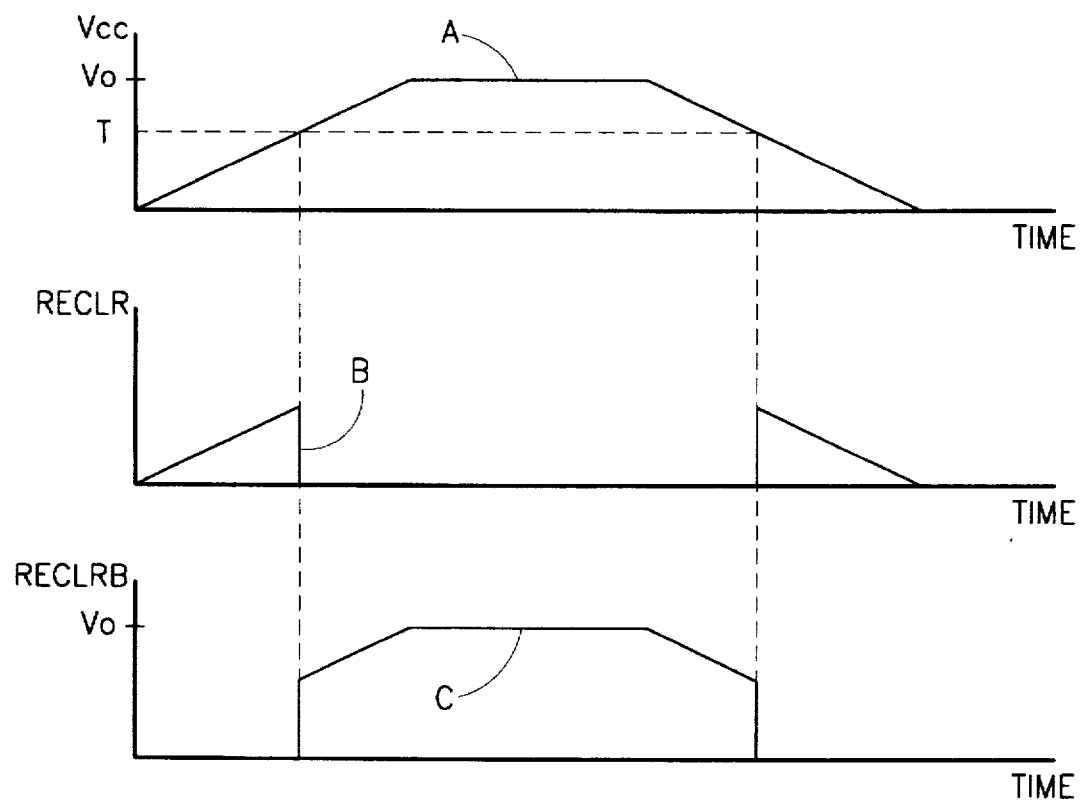
FIG. 2 is a graphical illustration of two signals known as "recir" and "recirb" and the main power supply signal to which they relate.
Figure 3:
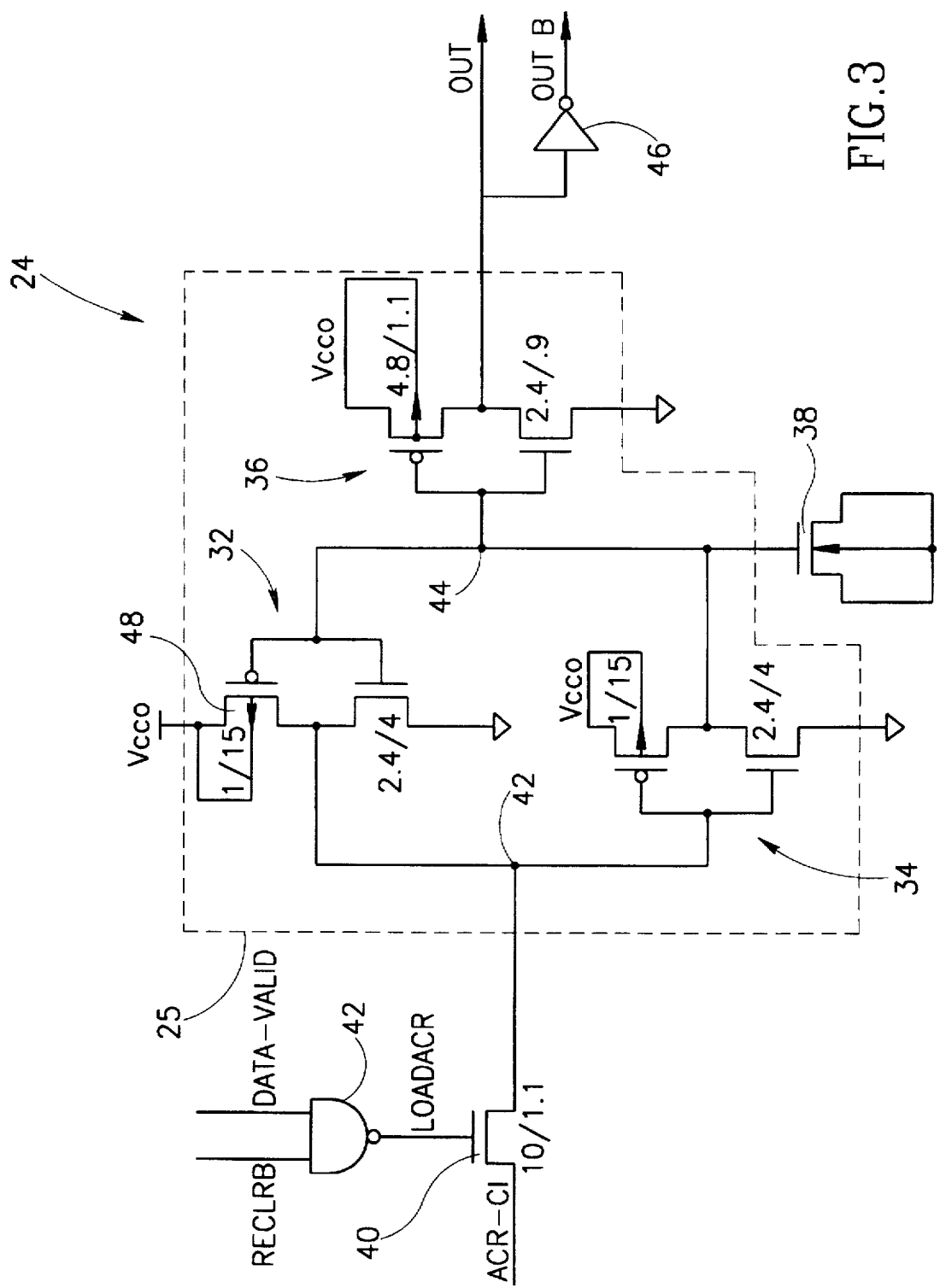
FIG. 3 is a circuit diagram illustration of a local latch, constructed and operative in accordance with a preferred embodiment of the present invention, forming part of the unit of FIG. 1.

Reference is now made to FIG. 2 which has three graphs A, B and C which respectively illustrate the relationship between the main supply Vcc, an "recir" signal which follows the main supply Vcc until a predetermined trip point T and an "recirb" signal which is the complement of the recir signal. Reference is also made to FIG. 3 which illustrates the elements of one local latch 24.

FIG. 2 illustrates the three voltage signals Vcc, recir and recirb signals over time. The main power supply Vcc (graph A) initially rises to its full value $V_o$ and stays at that level until being switched off, at which point, Vcc drops back to zero.

Graph B indicates that the recir signal follows the voltage level of the main power supply Vcc until main supply Vcc reaches a certain voltage level T. Above voltage level T, the recir signal drops back to a zero voltage level. Voltage level T minimally is larger than a minimum operating voltage Vmin below which none of the CMOS elements of the device will work predictably. The minimum operating voltage Vmin is typically the sum of the threshold levels of the n-channel and p-channel transistors, each of which is typically 0.8V. Thus, voltage level T typically is 1.8–2V.

Graph C indicates that the recirb signal is the complement of the recir signal, having no voltage as the main power supply rises but rising to follow the main power supply Vcc after it rises above the voltage level T. Thus, the recirb signal is at zero voltage while the main power supply is below voltage level T and at Vcc when the main power supply is above voltage level T.

The circuit which produces the recir and recirb signals is described hereinbelow with respect to FIG. 4.

Each local latch 24 of FIG. 3 comprises a standard latch 25, a capacitor 38 and a pass transistor 40. In the first embodiment with the architecture configuration register 12, each local latch additionally comprises a NAND gate 42 which receives the recirb signal and a "data-valid" signal, produced by a subsystem associated with the architecture configuration register 12, which internally verifies that the logic levels of the elements of register 12 are correct thereby indicating that the data within the architecture configuration register 12 is valid. The subsystem is a standard part of architecture configuration register 12 and therefore, will not be described herein in detail.

Pass transistor 40 is controlled by a "loadacr" signal produced by NAND gate 42 and receives the ACR configuration bit signal as input. In embodiments maintaining data from elements other than architecture configuration register 12, such as the embodiment of FIG. 1B, pass transistor 40 is controlled by a signal similar to the loadacr signal which indicates that both the data is valid and the main power supply has achieved a large enough voltage level to ensure that the transistors of the device will operate properly.

When the loadacr signal is active (e.g. when both the recirb signal is active, indicating that the main power is fully active and the data-valid signal is active, indicating that the signals from the architecture configuration register 12 are valid), pass transistor 40 passes the signal to be maintained to latch 24. In the first embodiment the signal is the configuration bit signal acr-ci received from architecture configuration register 12. The latter latches the value of the acr-ci signal, which is at least during battery power, the loadacr signal is inactive and accordingly, pass transistor 40 isolates the architecture configuration register 12 from the latch 25. Thus, when register 12 puts out undefined signals, latch 25 instead provides the configuration bit data stored therein.

Latch 25 utilizes the switched power supply Vcco and comprises three inverters 32, 34 and 36. Inverters 32 and 34 are connected together in a ring and have two nodes 42 and 44 therebetween. In the ring, node 42 is connected to the output of inverter 32 and to the input of inverter 34. Node 42 is also connected to the output of pass transistor 40. The output of inverter 34 is connected to a node 44 which is connected to the input of both inverters 32 and 36. Capacitor 38 is connected in parallel to node 44. It is noted that the n-wells of all of the p-channel transistors are powered by the Vcco source.

Before the main supply Vcc ever powers up, the architecture configuration register 12 provides undefined output signals. Since recirb is zero when main power supply Vcc is not active, the loadacr signal is not active and thus, pass transistor 40 isolates register 12 from latch 25, thereby avoiding latching of undefined data.

After battery insertion, latch 25 can operate but, since it has not yet latched any data (loadacr is still inactive), its output would be undefined despite its isolation from register 12. However, capacitor 38 stores the charge flowing within the ring of inverters 32 and 34, thereby removing charge from node 44. The result is a known default value (node 44 is maintained at a low voltage value) achieved after battery insertion and before first power up.

Inverters 32 and 36 invert the value of node 44, respectively producing battery high voltage values at node 42 and as an output signal. If the default value of the configuration bit should be low, a further inverter 46 can be included.

Upon first power up and only once both the main supply Vcc is above the voltage level T (e.g. recirb active) and the data in the architecture configuration register 12 is valid (e.g. data-valid active), the loadacr signal activates pass transistor 40 to pass the configuration bit signal which is now valid. Since pass transistor 40 is significantly larger in size than the p-channel transistor, labeled 48, pass transistor 40 controls the voltage level of node 42, lowering node 42 to a low level if the configuration bit signal is low or maintaining node 42 at a high level otherwise. Latch 25 then latches the value of the acr-ci signal and provides it to whatever element requires it. Furthermore, latch 25 will continually latch the value of the acr-ci signal even if it changes over time.

It is noted that pass transistor 40, being an n-channel transistor, will be inactivated once its gate-to-source voltage drop (Vgs) is below the n-channel threshold level Vtn and the voltage level of node 42 is at the full Vcc level. To change the voltage level of node 42, the acr-ci signal must drop below the voltage level of the loadacr signal by at least one threshold level Vtn.

It will be appreciated that the voltage level of node 42 will remain at the high voltage level as long as the voltage level of the acr-ci signal remains within one threshold level Vtn of the gate voltage level, defined by the loadacr signal. Since the voltage levels of the loadacr signal (a function of the recirb signal), the acr-ci signal and node 42 follow the voltage level of the main power supply and fall together therewith, the acr-ci signal will be maintained within one threshold level Vtn of the loadacr signal. Therefore, node 42 will be maintained at the high level (if acr-ci is high) while the main power supply falls. Once either the recirb signal becomes inactivated or the data-valid signal (which indicates the validity of the acr-ci signal) becomes inactivated, the pass transistor 40 isolates latch 25 from the architecture configuration register 12 at which point, latch 25 provides the latched high value as output therefrom.

If acr-ci is at the low voltage level when the voltage level of the main power supply Vcc begins to fall, the pass transistor 40 will remain activated and will continually pass the low voltage level to node 42 until either the recirb or the data-valid signal becomes inactivated. Curing battery power, latch 25 provides the latched low value as output.

Upon power up, pass transistor 40 will not be reactivated until both the main power supply is above the minimum operating voltage level Vmin (as indicated by the recirb signal) and the data in architecture configuration register 12 is valid. Therefore, any changes to the value latched in latch 25 will only occur because there was a change in the data in register 12.

Figure 4:
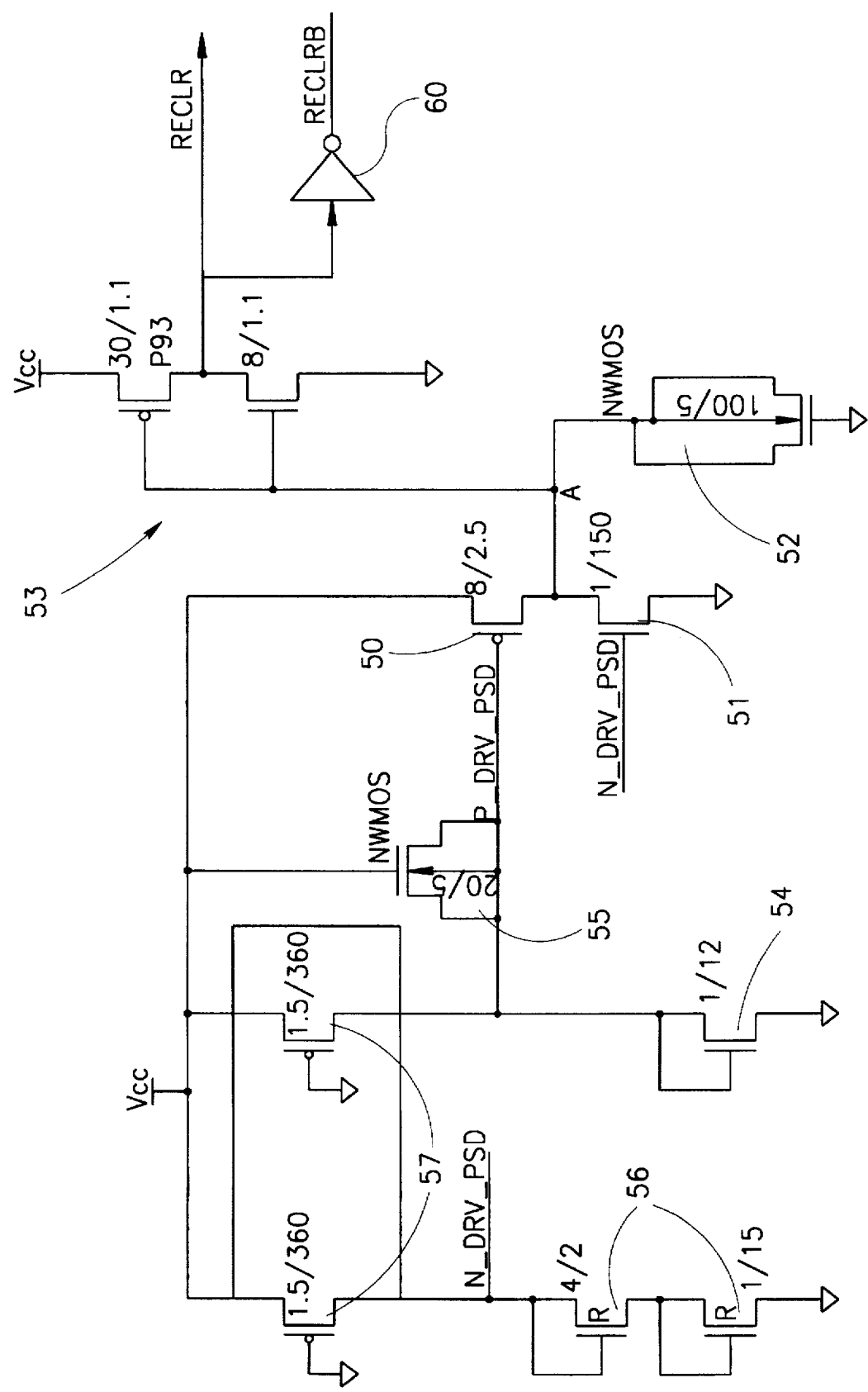
FIG. 4 is a circuit diagram illustration of a circuit for producing the recir and recirb signals.

Reference is now briefly made to FIG. 4 which illustrates the circuit which produces the recir and recirb signals. The circuit comprises a pull-up p-channel transistor 50, a leaker transistor 51, a capacitor 52, and inverter 53, a diode-connected n-channel transistor 54 and a second capacitor 55.

Diode-connected transistor 54 produces a relatively steady signal, p__drv__psd, whose voltage level is just above the threshold level Vtn of transistor 54. The signal p__drv__psd controls pull-up transistor 50 which receives, at its source, the main power supply Vcc. Its drain is connected to a node A which is also the source for leaker transistor 51, a small transistor which continually leaks a small current. Since the signal p__drv__psd is a low signal but not at the logic low level, pull-up transistor 50 begins to conduct only once its source is higher, by the amount of its threshold voltage Vtp, than its control signal p__drv__psd (which is at or close to Vtn). Thus, pull-up transistor 50 begins to conduct when Vcc is higher than Vtp+Vtn (i.e. from 1.8V–2V).

Inverter 53 inverts the level of node A, thereby producing the recir signal. Thus, when the main power supply Vcc is below Vtp+Vtn, inverter 53 inverts the low level of node A to the Vcc level. However, since transistor 50 is physically much larger than leaker 51 (for example, transistor 50 might be of size 8/2.5 and leaker 51 of size 1/150), once pull-up transistor 50 conducts, it overcomes the effect of leaker 51 and relatively quickly changes node A to the level of the main supply Vcc. Inverter 53 then inverts the level of node A and produces a zero voltage signal. Thus, the recir signal follows the voltage level of the main power supply Vcc until it reaches a threshold level T which in this circuit is equal to Vtp+Vtn. Above the voltage T, the recir signal drops to the zero voltage level.

Inverter 60 inverts the recir signal to produce the recirb signal. Thus, above voltage T, the recirb signal follows the main supply Vcc and below voltage T the recirb signal is at the zero voltage.

The transistors of the circuit of FIG. 4 typically have low leakage currents and, as such, do not respond quickly to rapid transitions of their input signals. Therefore, capacitors 52 and 55 are included to maintain node A and the p_drv_psd signal, respectively, at the desired voltage level during the rapid transition. Capacitor 52 couples node A to ground and capacitor 55 couples the p_drv_psd signal to the main power supply Vcc.

The circuit of FIG. 4 additionally shows two diode-connected n-channel transistors 56 which produce the control signal for leaker transistor 51 and transistors 57 which provide a resistance level to the circuit.

It sill be appreciated by persons skilled in the art that the present invention is not limited to what has been particularly shown and described hereinabove. Rather the scope of the present invention is defined only by the claims which follow:

We claim:

1. A configuration unit comprising:

an architecture configuration register powered by a main power supply and storing at least one battery backable configuration bit; and one local latch per battery backable configuration bit powered by a switched power supply which switches between main and battery power supplies, for latching the value of said battery backable configuration bit during main power and for maintaining said value during battery operation.

2. A configuration unit according to claim 1 and wherein said local latch comprises:

a latch for latching said value; and a pass transistor for passing said value to said latch when both the data of said architecture configuration register is valid and said main power supply is above a predetermined voltage level and for isolating said latch from said architecture configuration register otherwise.

3. A configuration unit according to claim 2 wherein said latch comprises means for forcing a default output prior to first powering up of said main power supply.

4. A configuration unit according to claim 2 and also comprising a control line controlling said pass transistor and carrying a control signal which is active only when both the contents of said architecture configuration register are valid and the main power supply is above a minimum operating voltage level.

5. A unit for maintaining the value of information regarding the state of a device during battery power, the unit comprising:

a state machine having a state defined by bits of state; and one local latch per bit of state to be maintained, said latch being powered by a switched power supply when switches between main and battery power supplies, for latching the value of said bit of state during main power and for maintaining said value during battery operation.

6. A unit according to claim 5 and wherein said local latch comprises:

a latch for latching said value; and a pass transistor for passing said value to said latch when both the data of said bit of state is valid and said main power supply is above a predetermined voltage level and for isolating said latch from said state machine otherwise.

7. A unit according to claim 6 wherein said latch comprises means for forcing a default output prior to first powering up of said main power supply.

8. A unit according to claim 6 and also comprising a control line controlling said pass transistor and carrying a control signal which is active only when the main power supply is above a minimum operating voltage level.

9. A unit according to claim 5 and wherein said state machine is a programmable logic device.

* * * * *